United States Patent [19]

Matsuoka et al.

[11] Patent Number: 4,946,764

[45] Date of Patent: Aug. 7, 1990

[54] METHOD OF FORMING RESIST PATTERN AND RESIST PROCESSING APPARATUS USED IN THIS METHOD

[76] Inventors: Yasuo Matsuoka, 102 Toshiba-Kosugi-Ryo, 1-526, Kosugi-cho, Nakahara-ku, Kawasaki-shi; Takashi Tsuchiya, 105 Heim-Hanazone, 3-4-31, Hanazono-cho, Kitakami-shi, Iwate-ken, both of Japan

[21] Appl. No.: 129,907

[22] Filed: Dec. 7, 1987

Related U.S. Application Data

[63] Continuation of Ser. No. 811,740, Dec. 20, 1985, abandoned.

[30] Foreign Application Priority Data

Dec. 21, 1984 [JP] Japan ................................ 59-269985
Dec. 21, 1984 [JP] Japan ................................ 59-269986

[51] Int. Cl.$^5$ .............................................. G03C 5/16
[52] U.S. Cl. .................................... 430/325; 430/326; 430/327; 430/330; 427/374.1

[58] Field of Search ............... 430/325, 326, 327, 328, 430/330; 355/30; 427/55, 374.1

[56] References Cited

U.S. PATENT DOCUMENTS 4,717,645 1/1988 Kato et al. .......................... 430/296

FOREIGN PATENT DOCUMENTS 0114126 7/1984 European Pat. Off. ............ 430/313
157223 8/1985 Japan .................................. 430/327

Primary Examiner—Jose G. Dees

[57] ABSTRACT

A method for forming a resist pattern comprises the steps of coating a resist on a substrate, baking the resist, selectively radiating electromagnetic waves or particle rays onto a surface of the resists, and developing the resist. The method further comprises, after the baking step and before the developing step, the step of cooling the resist in such a manner that a temperature control plate is disposed parallel to and adjacent to the substrate.

4 Claims, 3 Drawing Sheets

METHOD OF FORMING RESIST PATTERN AND RESIST PROCESSING APPARATUS USED IN THIS METHOD

This application is a continuation of application Ser. No. 811,740 filed Dec. 20, 1985, now abandoned.

BACKGROUND OF THE INVENTION

I. Field of the Invention

The present invention relates to a method of forming both a resist pattern and the resist processing apparatus used in this method.

II. Description of the Prior Art

As the integration density of semiconductor devices increases, as in super LSIs (large scaled integrated circuits), high precision micropattern formation techniques become necessary. The dimensional requirements of a pattern are very exacting. In the most advanced fields, a dimensional precision of $3\sigma \leq 0.1$ $\mu m - \sigma$ indicates deviation from an average pattern size- is now necessary for 5- or 6-inch masks. In order to utilize pattern formation techniques in a mass production line, size deviations between photomasks or wafers must be suppressed to fall within the range of $3\sigma \leq 0.15$ $\mu m$.

Meanwhile, in order to effectively mass produce pattern formations, a resist, having not only a high sensitivity but also a sensitivity suitable for the exposure apparatus used, is required.

Conventionally, the following method for forming a resist pattern has been adopted for use. A resist is coated on a substrate (e.g., a mask substrate) by a spin coating or dipping method. The resist film on the substrate is baked to a predetermined temperature (Tb) by a heating means (e.g., an oven or hot plate). After baking for a predetermined period of time, the resist film-coated substrate is allowed to cool naturally in atmosphere at ambient temperature and pressure for 20 to 30 minutes. After cooling, the resist film on the substrate is exposed with a suitable dose of radiation. The resist film on the substrate is then developed and rinsed, thus forming a resist pattern.

In the conventional method, however, it is difficult to obtain a resist film having uniform sensitivity. Sensitivity not only varies from one portion to another in a single surface of a resist film, but furthermore, variations in sensitivity also occur between resist films on individual substrates. Consequently, even if exposure conditions are constant, it is very difficult to form a resist pattern of high precision either on a surface of a single substrate or the surfaces of a plurality of substrates.

The present inventors undertook extensive studies to determine the cause of the variations in the size of resist patterns formed by the conventional method. It was found that the sensitivity of a resist becomes nonuniform due to uneven cooling after the baking process, resulting in variations in the size of the resist pattern. It was confirmed that when a substrate with a resist film is naturally cooled while leaving it to stand vertically after the baking process, the upper portion of the resist film is cooled in accordance with curve A in FIG. 1, and its lower portion is cooled in accordance with curve B in FIG. 1. When the sensitivity of the naturally cooled resist film is checked, the upper and lower portions of the resist film exhibit the sensitivity characteristics indicated in FIG. 2 by curves A' and B', respectively. Note that FIG. 2 shows a residual rate of film thickness due to a change in exposure dose. As can be understood from a comparison of FIGS. 1 and 2, a strong correlation was found between the cooling rate and the sensitivity of a resist film, and this was determined as being the cause of variations in the size of resist patterns.

Because the conventional resist film formation method employs a cooling step during which the cooling rate is uncontrolled, the sensitivity of the formed resist film becomes unstable and nonuniform, thus hindering the formation of a precisely dimensioned resist pattern.

As a means of responding to the need for a highly sensitive and uniformly dimensioned resist, it is conceivable that a method in which, after baking, a substrate is conveyed into a chamber where it can cool under conditions of precise temperature control, may be proposed. A method such as this, however, would, in addition to being complex, be very expensive.

In view of the above situation, a method for increasing the cooling rate of a resist film after baking so as to obtain a high-sensitivity resist, for example, a method of dipping a substrate in a fluid in which resist does not dissolve, has been proposed. However, a drying step made necessary by the dipping step is complex. In addition, although high sensitivity is achieved, variations in sensitivity in a single substrate surface are undesirably enhanced to a greater extent than when the conventional method, employing natural cooling, is used. Therefore, with these methods, it is difficult to form a highly sensitive and uniformly dimensioned resist pattern without employing a complex and expensive method.

Summary of the Invention

It is an object of the present invention to provide a method of forming a resist pattern on a substrate, and, more particularly, to provide a method wherein sensitivity of the resist is stabilized so that resist patterns can be formed with uniform high precision sensitivity and size whether on a single substrate or on a plurality of substrates.

It is another object of the present invention to provide the resist processing apparatus used in the above method.

The present inventors found that the sensitivity of a resist is closely related to the cooling rate after baking, particularly to a cooling rate near the glass transition point of the resist, with variations in the sensitivity of the resist being caused by nonuniform cooling. The present inventors also found that although the sensitivity of a resist can be increased by rapid cooling after baking, the rapid cooling process causes nonuniform cooling and results in variations in sensitivity and, ultimately, size. The present invention has been devised in light of these findings.

According to a first embodiment of the present invention, there is provided a method of forming a resist pattern comprising the steps of:

coating a resist on a substrate;
baking the resist;
selectively radiating electromagnetic waves or particle rays onto a surface of the resist; and
developing the resist. The method further comprises, after the baking step and before the developing step, the step of cooling the resist in such a manner that a temperature control plate is disposed parallel to and adjacent to the substrate.

The substrate used herein can be, for example, a mask substrate, a semiconductor wafer or a semiconductor wafer coated with a semiconductor film, an insulating film, a metal film or the like.

Examples of the resist include, for example, a photoresist, a far ultraviolet sensitive resist, an electron beam sensitive resist, an X-ray sensitive resist, a high-acceleration, X-ray sensitive resist, an ion beam sensitive resist, and the like. Because of its ability to ensure that the sensitivity of resist patterns is stabilized to a high degree, the present invention is particularly effective in patterning a positive resist consisting of fluorine-containing polymethyl methacrylate (PMMA).

Disposed parallel to and adjacent to the temperature control plate in the cooling step, the substrate coated with a selected resist film is cooled to a desirable temperature which does not adversely influence the dimensional uniformity of the resist pattern, a temperature lower than the glass transition temperature of the resist by 30° C. or more. After cooling to this specific temperature, the substrate can be placed on a temperature control plate that enhances the cooling efficiency. In order to stabilize the sensitivity of a single substrate, surface during this cooling step, the distance between the substrate and the temperature control plate, the time interval until the substrate is disposed adjacent to the temperature control plate, and the temperature of the temperature control plate are adjusted to control the cooling rate of the resist film.

The cooling step of the resist film can, according to the present invention, be performed in various ways. For example, the substrate can be cooled while it is moved to the temperature control plate gradually or stepwise. In this case, the substrate can be brought into contact with the plate in the end, or stopped at a position a given distance from the plate. In addition, after the substrate is stopped, it can be brought into contact with the plate. Alternatively, the substrate can be cooled while it is kept at a position a given distance from the plate from the beginning. In this case, the substrate can be brought into contact with the plate at the same point. In any case, the substrate is preferably brought into contact with the plate after the temperature of the resist becomes lower than its glass transition point by 30° C. or more. When the substrate is stopped at a given distance from the plate, the distance is preferably 20 mm or less and more preferably 5 mm or less. As long as the substrate is not brought into contact with the plate, they can be very close to each other.

According to a second embodiment of the present invention, there is provided a resist processing apparatus comprising:

a baking chamber for baking a resist film coated on a substrate;

a cooling chamber for cooling the baked resist film;

conveyance means for conveying the substrate coated with the baked resist film from the baking chamber to the cooling chamber; and a shutter interposed between the baking and cooling chambers so as to partition them, the shutter being capable of freely opening or closing.

The baking chamber comprises heating means while the cooling chamber comprises a temperature control plate which is arranged horizontally at a level lower than that of the substrate in the baking chamber. The cooling chamber further comprises means for moving the substrate, which has been conveyed into the cooling chamber by the conveyance means, downward so that it is parallel to and adjacent to the temperature control plate without contacting it.

The means for moving the substrate downward can be four heat insulating pins which vertically extend through the four corners of the temperature control plate. Upon being conveyed into the cooling chamber, the substrate is situated over top the ends of the pins and, in this position, moved downward by retraction of the pins. The temperature control plate can have a cooling medium circulating pipe and a heater buried therein. Alternatively, a plurality of Peltier effect elements can be aligned on the surface of the temperature control plate.

According to the present invention, the sensitivity of a resist is stabilized, so that resist patterns can be formed with uniform high precision sensitivity and size whether on a single substrate or on a plurality of substrates.

DETAILED DESCRIPTION OF THE PREFERRED EMBODIMENT

An embodiment of the present invention will be described with reference to the accompanying drawings.

Figure 1:
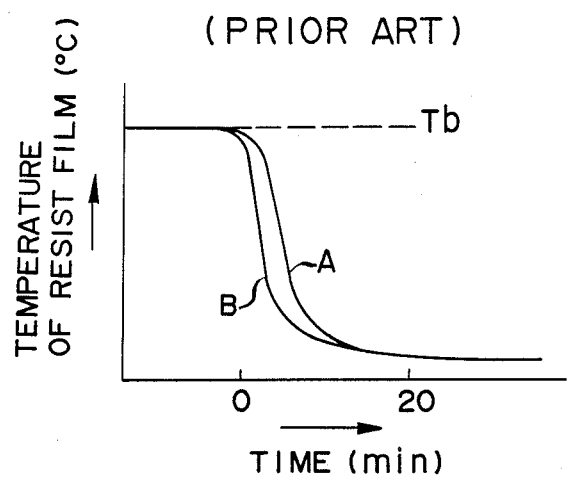
FIG. 1 is a graph showing a change in the temperature of a resist film over time when a substrate coated with a resist film is naturally cooled in a vertical position after baking.
Figure 2:
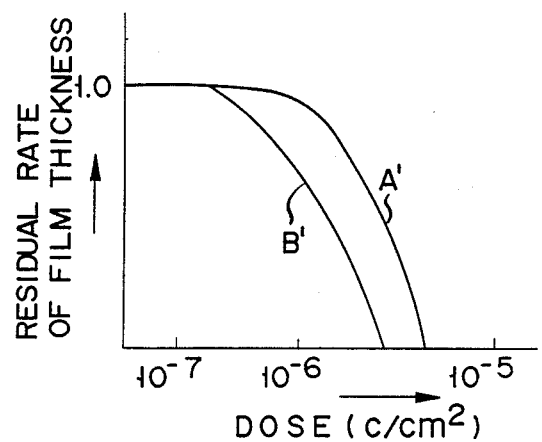
FIG. 2 is a graph showing residual rate of film thickness upon a change in the exposure dose of the resist film which is cooled in accordance with the cooling curves shown in FIG. 1.
Figure 3:
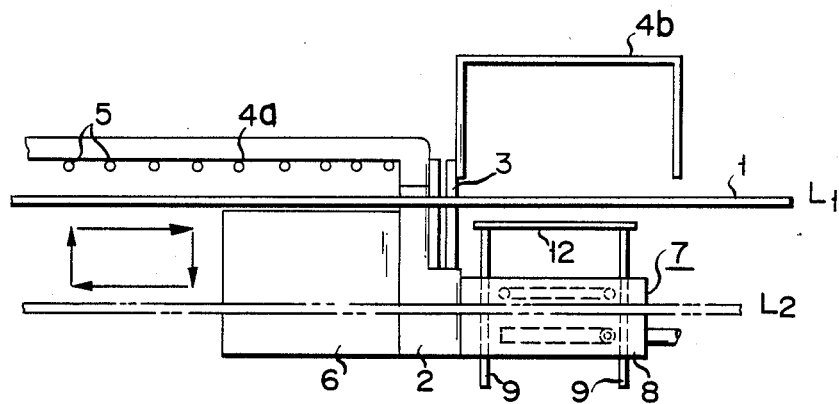
FIG. 3 is an illustration showing a resist processing apparatus according to an embodiment of the present invention.

FIG. 3 is a schematic view showing the baking/cooling apparatus constituting the resist processing apparatus of the present invention. Reference numeral 1 denotes walking beams, comprising a pair of beam-like rails, which can be moved forward, downward (toward position L2), backward, and upward (toward position L1), as indicated by arrows in FIG. 3. Heat insulating plate 2, for separating a baking chamber from a cooling chamber, and double shutter 3 are provided midway along walking beams 1. Double shutter 3 can be freely opened/closed. First heat insulating cover 4a is fixed to plate 2 above beams 1 at the side of the baking chamber. Heating elements 5 are mounted on the inner surface of cover 4a. Heat plate 6, for a baking process, is disposed below beams 1 at the side of the baking chamber. Second heat insulating cover 4b is mounted above beams 1 at the side of the cooling chamber. Cooling mechanism 7 is arranged below beams 1 at the side of the cooling chamber.

Figure 4:
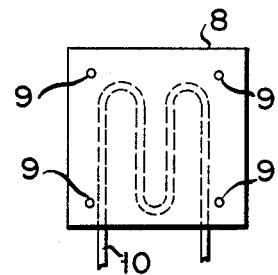
FIG. 4 is a plan view of the temperature control plate used in the apparatus shown in FIG. 3.
Figure 5:
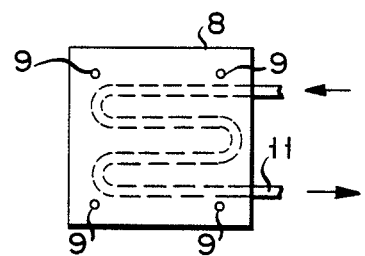
FIG. 5 is a bottom view of the temperature control plate shown in FIG. 4.

Mechanism 7 comprises temperature control plate 8 and four heat insulating pins 9. Pins 9 extend through four corners of plate 8 and support a substrate, conveyed along beams 1, for the purpose of moving it downward. As shown in FIGS. 4 and 5, M-shaped or zigzag heater 10 is buried in an upper surface of plate 8, and M-shaped or zigzag pipe 11, for circulating cooling medium, is buried in a lower surface thereof. Heat insulating pins 9 are made of a heat resistant resin such as a fluorine-containing resin, Delrin, and the like. Beams 1 and plate 8 are separated from each other by, for example, 20 mm. Beams 1 and the nearest ends of pins 9 are separated by 2 mm. Note that a pair of grooves are formed in corresponding portions of plates 6 and 8 so that beams 1 can be moved downward to a level below the surfaces of these plates. Beams 1 move downward along the grooves to the bottom portion.

A method of forming a resist pattern using the above baking/cooling apparatus will now be described. A mask substrate coated with an EB (electron beam) resist having a glass transition temperature (Tg) of 133° C. was placed on walking beams 1. While double shutter 3 was kept open, beams 1 were driven forward so as to position substrate 12 above plate 6. Substrate 12 was baked by plate 6 and elements 5 to a temperature of 200° C. (Tb).

Beams 1 were again driven forward and then downward so as to shift them from position L1 to L2. Thus, substrate 12 on beams 1 was set on the distal ends of pins 9, and, at the same time, double shutter 3 was closed. Subsequently, pins 9 were moved downward. Substrate 12 on pins 9 was cooled while gradually moving it toward plate 8 which was set at 25° C. Substrate 12 was finally brought into contact with plate 8. In this, the cooling step, the time required to transfer substrate 12 onto pins 9 from beams 1 is set at 1 minute, and, similarly, the time required to bring substrate 12 on pins 9 into contact with plate 8 is also set at 1 minute. Thereafter, from the lower position beams 1 were driven upward after 8 minutes had elapsed from the end of the cooling step, thereby returning substrate 12 from plate 8 onto beams 1. Beams 1 were then driven forward so as to convey substrate 12 to an exposure apparatus.

The cooled resist film was exposed to an electron beam of an acceleration voltage of 20 keV. The resultant film was developed for 10 minutes in a 25° C. solution of a mixture of methyl isobutyl ketone (MIBK) and isopropyl alcohol at a ratio of MIBK : IPA of 7 : 3. Finally, the film was processed for 30 seconds with a 25° C. IPA rinse solution to form a resist pattern on the mask substrate.

Figure 6:
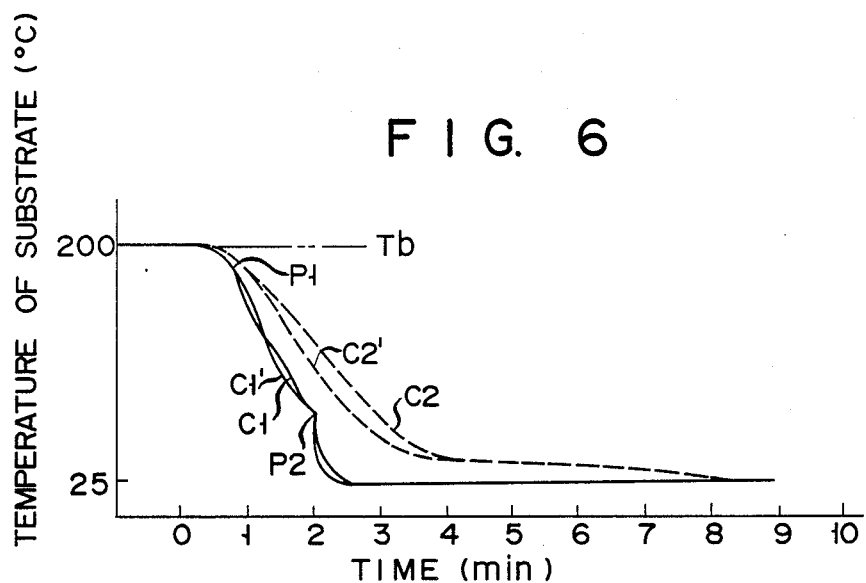
FIG. 6 is a graph showing a change in temperature at two given portions of a resist film during cooling steps according to the method of the present invention and the conventional method.

When the central and peripheral temperatures of the substrate were measured during the cooling step of this embodiment, the results shown in the graph of FIG. 6 were obtained. Referring to FIG. 6, temperature curve C1 corresponds to the central portion of this embodiment's substrate; temperature curve C1' corresponds to a peripheral portion thereof; temperature curve C2 corresponds to the central portion of a substrate which is naturally cooled after baking (the conventional method); and temperature curve C2' corresponds to a peripheral portion of the substrate used in the conventional method. Referring again to FIG. 6, reference symbol P1 indicates the timing at which a substrate is moved from the walking beams onto heat insulating pins, and P2, the timing at which the substrate is placed on the temperature control plate. As can be seen from FIG. 6, in comparison to the conventional method, the method of this embodiment, ensures that the surface temperature of a mask substrate is kept uniform during cooling.

Figure 7:
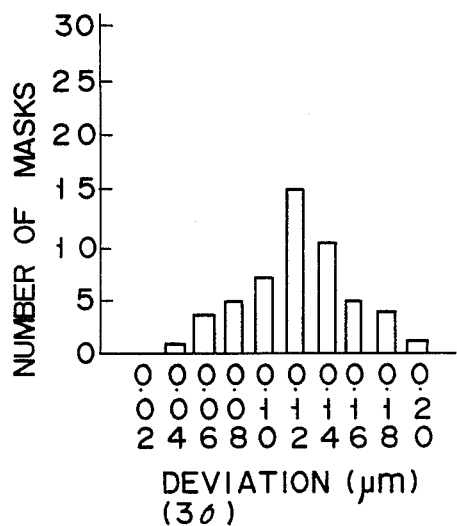
FIG. 7 is a graph showing variations in the size of a resist pattern formed according to the conventional method.
Figure 8:
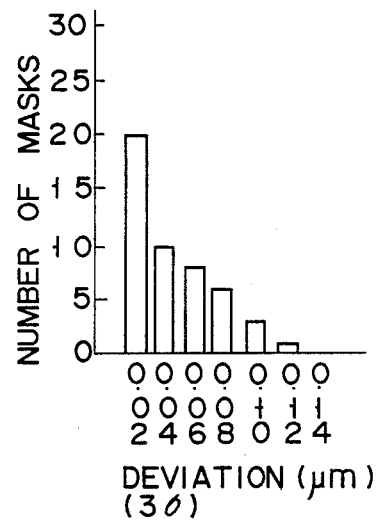
FIG. 8 is a graph showing variations in the size of a resist pattern formed according to the method of the present invention.

Size variations in the surfaces of resist patterns formed by the conventional method and the method of the present invention were checked and compared. In each method, identical resist patterns were formed on a plurality of mask substrates; variations in their sizes (i.e., $3\sigma$) were calculated, and the number of masks indicating various $3\sigma$s for every 0.02 μm was then obtained. The conventional method, produced the results shown in the graph of FIG. 7, while the method of this embodiment produced the results shown in the graph of FIG. 8. As can be seen from FIGS. 7 and 8, while variations in surface are $3\sigma=0.15$ μm (average value) in the conventional method, in this embodiment, variations are $3\sigma=0.04$ μm (average value), twice or more that of the conventional film.

Note that in the above embodiment, the baking step of the resist film is performed immediately after the coating step. However, if the baking step is performed after the exposure step and before the developing step, the same effect can be obtained.

What is claimed is:

1. A method of forming a resist pattern comprising the steps of:
   coating the resist film on a substrate;
   baking said resist film;
   selectively radiating electromagnetic waves or particle rays onto a surface of said resist film; and
   developing said resist film, wherein said method further comprises, after the baking step and before the developing step, the step of cooling said resist film in such a manner that a temperature control plate is disposed opposite said substrate, said substrate is moved gradually or stepwise toward said temperature control plate and said substrate is stopped at a position which is separated from said temperature control plate by a distance of not more than 20 mm, and said substrate is brought into contact with said temperature control plate after the temperature of said resist film is lower than a glass transition temperature thereof by at least 30° C.

2. A method according to claim 1, wherein the cooling step is performed before the radiating step.

3. A method according to claim 1, wherein the cooling step is performed after the radiating step.

4. A method according to claim 1, wherein the distance is not more than 5 mm.

* * * * *

UNITED STATES PATENT AND TRADEMARK OFFICE
CERTIFICATE OF CORRECTION

PATENT NO. : 4,946,764
DATED : August 07, 1990
INVENTOR(S) : MATSUOKA et al

It is certified that error appears in the above-identified patent and that said Letters Patent is hereby corrected as shown below:

ON TITLE PAGE:

Please insert the Assignee, --Kabushiki Kaisha Toshiba, Kawasaki-Shi, Japan --.

Signed and Sealed this

Seventh Day of July, 1992

*Attest:*

DOUGLAS B. COMER

*Attesting Officer*    *Acting Commissioner of Patents and Trademarks*